(12) United States Patent
Horio

(10) Patent No.: US 6,625,036 B1
(45) Date of Patent: Sep. 23, 2003

(54) INFRARED DATA COMMUNICATION MODULE AND METHOD OF MAKING THE SAME

(75) Inventor: Tomoharu Horio, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 203 days.

(21) Appl. No.: 09/653,268

(22) Filed: Aug. 31, 2000

(30) Foreign Application Priority Data

Aug. 31, 1999 (JP) .......................................... 11-245481
Sep. 8, 1999 (JP) .......................................... 11-254268
Sep. 10, 1999 (JP) .......................................... 11-256663

(51) Int. Cl.[7] .......................... H05K 7/02; H05K 7/06; H05K 7/08; H05K 7/10
(52) U.S. Cl. ...................................... 361/760; 361/764
(58) Field of Search ................................ 361/760–764, 361/776–779; 438/25–29; 257/80–85, 666–667, 700–703, 723–724

(56) References Cited

U.S. PATENT DOCUMENTS 5,506,445 A * 4/1996 Rosenberg .................. 257/100
5,677,575 A * 10/1997 Maeta et al. ................. 257/778
6,252,252 B1 * 6/2001 Kunii et al. ................. 257/433
6,320,686 B1 * 11/2001 Schairer ...................... 359/152

FOREIGN PATENT DOCUMENTS

JP 11-8415 1/1999

OTHER PUBLICATIONS

English Abstract of JP–A–11–8415.

* cited by examiner

Primary Examiner—Kamand Cuneo
Assistant Examiner—Tuan Dinh
(74) Attorney, Agent, or Firm—Michael D. Bednarek; Shaw Pittman LLP

(57) ABSTRACT

A method of making an infrared data communication module includes the steps of: forming predetermined wiring patterns on an obverse and a reverse surfaces (10a, 10b) of a substrate (1); mounting, on one of the surfaces of the substrate (1), a group of components including plural sets of light emitting elements (2) and light receiving elements (3); resin-packaging the group of components mounted on the substrate (1); and dividing the resin-packaged components to provide a plurality of infrared data communication modules (4) each of which includes a respective set of light emitting element and light receiving element. The resin-packaging step includes forming a plurality of mutually separated resin packages (4) each of which collectively seals at least two sets of light emitting elements (2) and light receiving elements (3).

5 Claims, 16 Drawing Sheets

INFRARED DATA COMMUNICATION MODULE AND METHOD OF MAKING THE SAME

TECHNICAL FIELD

The present invention relates to an infrared data communication module for performing data communication under so-called IrDa (Infrared Data Association).

BACKGROUND ART

An infrared data communication module for operation under IrDA is commonly used in the field of notebook personal computers, and recently, it is also used in a mobile phone or an electronic scheduler for example. Such an infrared data communication module includes an infrared LED, a photodiode and a modem circuit as enclosed in a single package for performing two-way wireless communication.

While the communication performance of the infrared data communication module is enhancing, there is an increasing demand for size reduction of the infrared data communication module. Moreover, dimensional accuracy is strictly required in manufacturing the infrared data communication module.

FIGS. 20 and 21 illustrate an example of prior-art method of making infrared data communication modules. According to the prior art method, use is made of a strip-like or rectangular substrate 1e on which plural sets of infrared light emitting elements 2e and infrared light receiving elements 3e are arranged in rows and then sealed in resin packages 4e.

In such a method, the number of the resin packages 4e is the same as the number of the sets of light emitting elements 2e and light receiving elements 3e, so that each resin package separately encloses a respective set of light emitting element 2e and light receiving element 3e. After the resin-packaging, the substrate 1e is cut at positions indicated by phantom lines L1, L2, thereby providing a plurality of infrared data communication modules.

However, the above-described conventional manufacturing method has the following problems.

According to the conventional method, a resin package 4e is provided separately for each set of light emitting element 2e and light receiving element 3e. This leads to an increase in the total number of the resin packages 4e while also increasing the number of clearances 90 provided between the resin packages 4e, thereby wasting the space of the substrate 1e. As a result, the number of infrared data communication modules obtainable from the substrate 1e of a given size decreases, which leads to an increase in the manufacturing cost of the infrared data communication modules.

To solve the problem described above, the inventor of the present invention has previously conceived the idea of causing a single resin package to enclose, on the substrate 1e, a group of components including plural sets of light emitting elements 2e and light receiving elements 3e. With such a method, it is possible to minimize the number of the resin packages for eliminating the wasted space (clearances 90) between the resin packages.

With the above measure, however, the resin package comes into intimate contact with the substrate 1e over a large surface area. Therefore, in the case where the substrate 1e has a small thickness or is made of a relatively soft material, the substrate 1e warps, consequently distorting the infrared data communication modules obtained from the substrate.

Further, as shown in FIG. 22, use is made of mold members P1, P2 for molding a resin package 4e to seal a light emitting element 2e and a light receiving element 3e on a substrate 1e. Specifically, the head mold member P1 having a configuration for defining the configuration of the resin package 4e presses against the obverse surface of the substrate 1e, whereas the tail mold member P2 which has a flat pressing surface presses against the reverse surface of the substrate 1e. Then, with the tail mold member P2 held in intimate contact with the reverse surface of the substrate 1e, resin is injected between the head mold member P1 and the obverse surface of the substrate 1e for solidification into the resin package 4e.

The substrate 1e is formed with through-holes 7 extending thicknesswise. The substrate 1e is further formed, on the reverse surface thereof, with terminals 71 connected to the through-hole 7, respectively. Since each of the terminals 71 made of a thin conductor film has a certain thickness, the reverse surface of the substrate 1e may become irregular. Therefore, the tail mold member P2 may not come into intimate contact with the substrate 1e, and the surface pressure against the reverse surface of the substrate 1e may be insufficient around the through-holes 7. As a result, a clearance may be formed between the reverse surface of the substrate 1e and the tail mold member P2. When resin is filled between the head mold member P1 and the substrate 1e in such a condition, the resin may flow via the through-holes onto the reverse surface of the substrate 1e. As a result, resin may be deposited on the reverse surface of the substrate 1e.

Moreover, before the sealing step and the cutting step described above, a predetermined conductor pattern (not shown) and the terminals 71 are formed on the obverse and the reverse surfaces of the substrate 1e, respectively, by photolithography for example. Specifically, a resist material is applied on the substrate 1e which is initially formed with a copper film on a surface thereof. Then, a mask having a predetermined pattern disposed on the substrate which is then subjected to light exposure, development and etching for removing unnecessary portions of the copper film.

Then, an insulating layer (not shown) called "green resist" is formed on the substrate 1e to cover portions of the substrate other than the conductor pattern and the terminals 71 which are to be exposed. For forming such an insulating layer, a similar mask is utilized for light exposure. At this time, if the mask positionally deviates, the exposed area of the conductor pattern and the terminals 71 may become small.

An infrared data communication module A may be mounted on a module mounting board 9 so that the reverse surface of the substrate 1e extends perpendicularly to an obverse surface of the module mounting board 9, as shown in FIG. 23. In this case, the terminals 71 on the reverse surface of the substrate and a wiring pattern P formed on the module mounting board 9 are bonded together solder.

However, if the exposed portions for the terminals 71 are small as described above, solder fillets are not sufficiently formed or likely to be easily detached. Therefore, the terminals 71 of the infrared data communication module and the wiring pattern P of the module mounting board 9 are not reliably connected.

DISCLOSURE OF THE INVENTION

An object of the present invention is to provide a method of making an infrared data communication modules which is capable of eliminating or lessening the problems described above while also providing such an infrared data communication module.

In accordance with a first aspect of the present invention, there is provided a method of making infrared data communication modules comprising the steps of: forming predetermined wiring patterns on an obverse and a reverse surfaces of a substrate; mounting, on one of the surfaces of the substrate, a group of components including plural sets of light emitting elements and light receiving elements; resin-packaging the group of components mounted on the substrate; and dividing the resin-packaged components into a plurality of infrared data communication modules each of which includes a respective set of light emitting element and light receiving element; wherein the resin-packaging step comprises forming a plurality of mutually separated resin packages each of which collectively seals at least two sets of light emitting elements and light receiving elements.

According to this method, the number of the resin packages needed is smaller than the number of the sets of light emitting elements and light receiving elements. Therefore, the number of clearances provided between the resin packages can be reduced so that the total area of the clearances can be reduced. As a result, the number of infrared data communication modules obtainable from a single substrate is larger than is obtainable in the prior art, which leads to a cost reduction in manufacturing the infrared data communication modules.

Moreover, unlike the prior art in which a group of components mounted on a surface of the substrate is sealed in a single resin package, an appropriate number of clearances are provided between the plural resin packages, so that the surface of the substrate includes portions which are not held in intimate contact with the resin packages. Therefore, warping of the substrate due to the formation of the resin packages on one surface thereof can be reliably prevented or reduced. As a result, the produced infrared data communication modules are free from strains to provide a high quality.

Preferably, the mounting step includes arranging the plural sets of light emitting elements and light receiving elements in a matrix on said one surface of the substrate, and the resin-packaging step includes forming the packages so as to be arranged in a matrix.

According to the above, the substrate is less likely to warp both longitudinally and widthwise of the substrate. Therefore, it is possible to further enhance the quality of the infrared data communication modules finally obtained from the substrate.

Preferably, the substrate is elongated in one direction to be rectangular or strip-like. The substrate is formed with a plurality of slits extending widthwise of the substrate and spaced from each other longitudinally of the substrate. The group of components is mounted on said one surface of the substrate in each of regions defined between the slits.

According to the above, the substrate is likely to be warped longitudinally at the slits. Therefore, in resin-packaging the components mounted in a region between each two slits, even if a bending stress is applied to the substrate, such a stress is absorbed and alleviated by the deformation of the substrate at the slits. As a result, it is possible to prevent such a stress from largely affecting the adjacent region. Therefore, the substrate can be more reliably prevented from flexing at the regions on which the components are mounted.

Preferably, the pattern forming step includes forming, on the reverse surface of the substrate, terminals for connection to through-holes penetrating the substrate thicknesswise together with dummy patterns which are substantially equal in thickness to the terminals.

According to such a method, the dummy patterns formed on the reverse surface of the substrate to have substantially the same thickness as the terminals connected to the through-holes provides a sufficient surface pressure when the substrate is compressively held by a mold. Therefore, the dummy patterns held in firm contact with the mold on the reverse surface of the substrate prevents resin, which enters into the through-holes from the obverse surface of the substrate, from flowing out onto the reverse surface of the substrate.

Preferably, the pattern forming step includes forming, on the reverse surface of the substrate, terminals for connection to through-holes penetrating the substrate thicknesswise. The terminals are elongated to be substantially rectangular for bonding to an external mounting board.

When an insulating layer is formed on the reverse surface of the substrate, by photolithography for example, in such a manner as to expose the terminals, the mask for light exposure may be disposed at a deviated position. However, since the terminals are elongated into a generally rectangular configuration according to this method, such a deviation may be allowed longitudinally of the terminals. Further, the elongated terminals provide a sufficient area utilized for effectively bonding to an external module-mounting board.

In accordance with a second aspect of the present invention, there is provided an infrared data communication module made by the steps of: forming predetermined wiring patterns on an obverse and a reverse surfaces of a substrate; mounting, on one of the surfaces of the substrate, a group of components including plural sets of light emitting elements and light receiving elements; resin-packaging the group of components mounted on the substrate; and dividing the resin-packaged components into a plurality of infrared data communication modules each of which includes a respective set of light emitting element and light receiving element; wherein the resin-packaging step comprises forming a plurality of mutually separated resin packages each of which collectively seals at least two sets of light emitting elements and light receiving elements.

The structure described above provides the same advantages as the first aspect of the present invention.

Preferably, the substrate may be formed with through-holes penetrating the substrate thicknesswise, and the reverse surface of the substrate may be formed with terminals for connection to the through-holes and dummy patterns which are substantially equal in thickness to the terminals.

Preferably, the obverse surface of the substrate may include sub-areas each for mounting a respective set of light emitting element and light receiving element, and the wiring patterns may be formed respectively in the sub-areas. The dummy patterns may correspond in position and in general configuration to the wiring patterns.

According to this structure, the wiring patterns having a certain thickness are formed at the sub-areas on the obverse surface of the substrate, whereas the dummy patterns having a corresponding thickness are formed on the reverse surface of the substrate in corresponding relation to the wiring patterns. Thus, the surface pressure applied by the mold are sufficiently increased so that the substrate and the mold are held in intimate contact with each other. As a result, the sub-areas can be reliably sealed with resin to reliably produce infrared data communication modules at respective sub-areas.

Preferably, the substrate may be formed with through-holes penetrating the substrate thicknesswise. The reverse surface of the substrate may be formed with terminals for connection to the through-holes and for bonding to an external mounting board. The terminals may be elongated to be substantially rectangular.

According to this structure, a solder fillet can be formed in an amount sufficient for strongly soldering each terminal on the reverse surface of the substrate to the wiring pattern on the module mounting board. Therefore, it is possible to increase the mounting strength of the infrared data communication module on the module mounting board.

Preferably, the terminals maybe so formed as to projects from an obverse surface of the mounting board when the substrate is mounted on the mounting board with the reverse surface of the substrate oriented perpendicularly to the obverse surface of the substrate.

Since the wiring pattern on the module mounting board has a predetermined width, there is a limitation on enlarging the terminals on the reverse surface of the substrate longitudinally thereof. However, it is possible to extend the terminals perpendicularly to the obverse surface of the module mounting board as much as possible the width of the substrate allows. Therefore, with the above-described structure, it is possible to form a sufficient amount of solder fillet.

Other features and advantages of the present invention will become clearer from the description of embodiments given below with reference to the accompanying drawings.

BEST MODE FOR CARRYING OUT THE INVENTION

Preferred embodiments of the present invention will be described below with reference to the accompanying drawings. Throughout the drawings, identical or similar elements are designated by the same reference signs.

Figure 1:
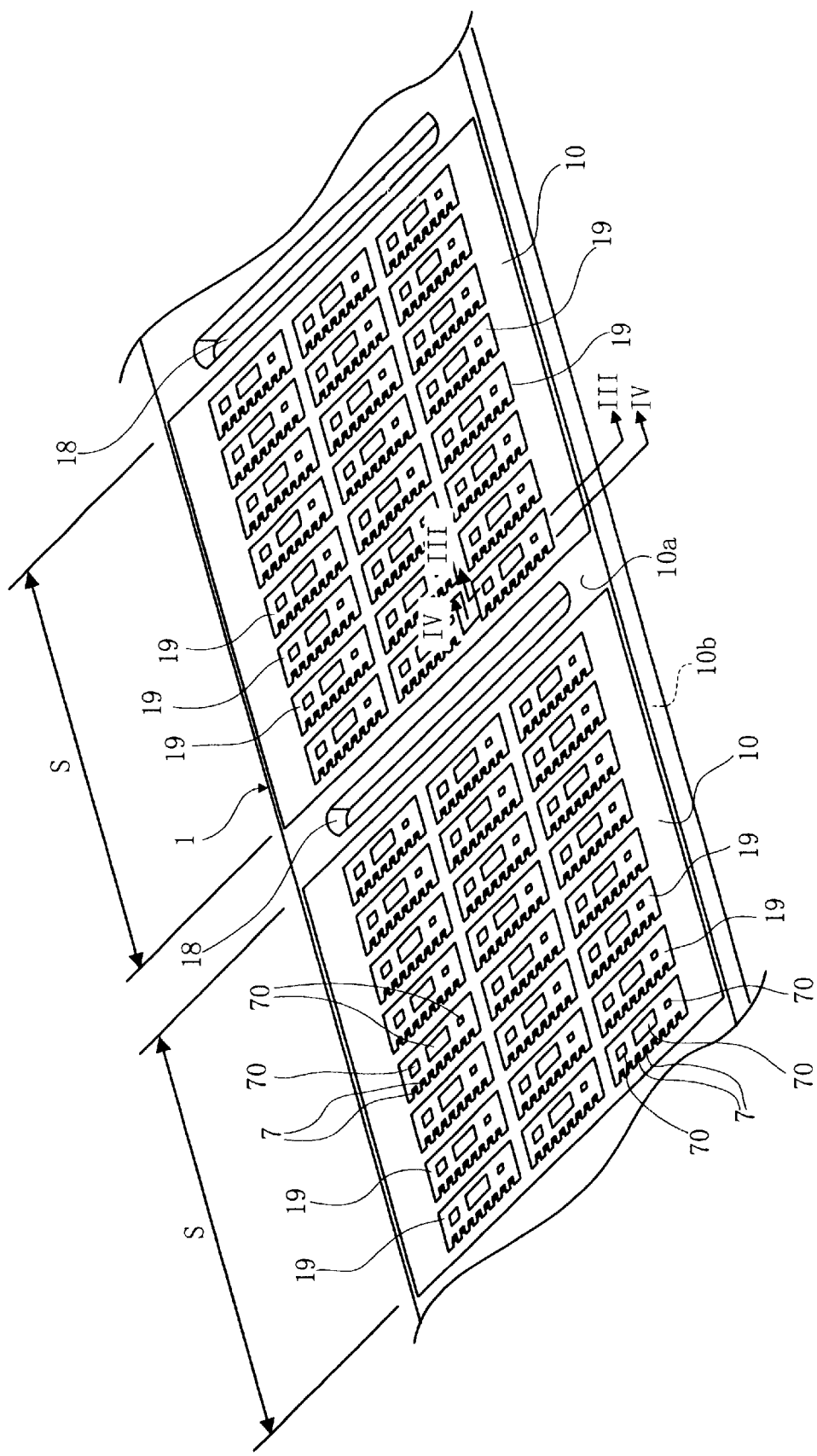
FIG. 1 is a perspective view of a substrate used for making infrared data communication modules in accordance with a first embodiment of the present invention.
Figure 2:
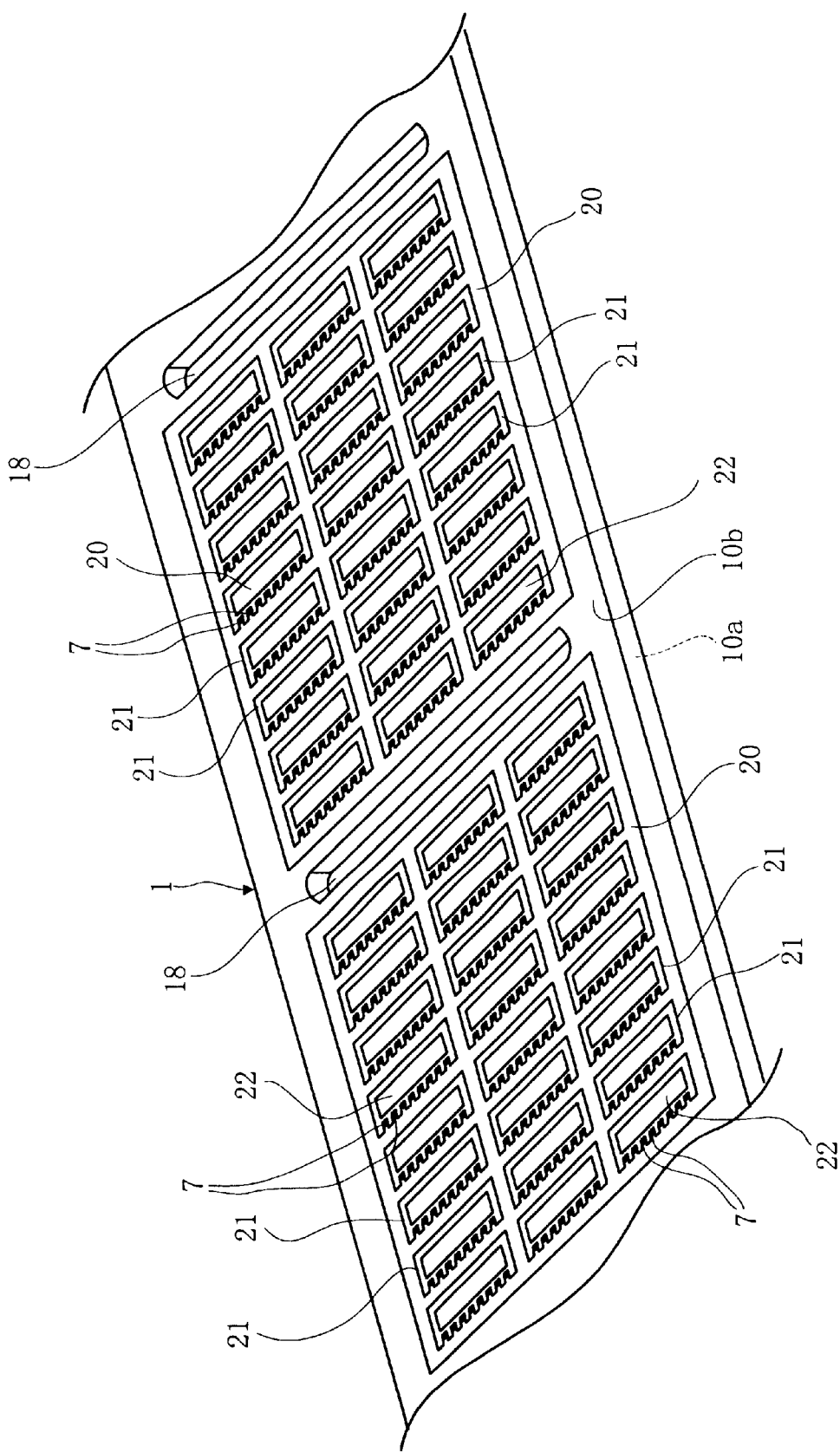
FIG. 2 is a perspective view of the substrate shown in FIG. 1 as viewed from the reverse side.

First, reference is made to FIGS. 1 through 13 which illustrate a method of making an infrared data communication module according to a first embodiment of the present invention. For making an infrared data communication module, use is made of a substrate 1, as shown in FIGS. 1 and 2. FIG. 1 shows the obverse side of the substrate 1, whereas FIG. 2 shows the reverse side of the substrate 1.

The substrate 1 may be made of glass-fiber-reinforced epoxy resin for example and has a rectangular or strip-like configuration elongated in one direction. The substrate 1 is formed with a plurality of slits 18 spaced from each other longitudinally of the substrate 1. Each of the slits 18 is narrow and extends widthwise of the substrate 1. The substrate 1 has an obverse surface 10a which provides component mounting regions S each between respective two adjacent slits 18 for mounting components, as described later. Each of the component mounting regions S includes a plurality of sub-areas 19 and a conductor layer 10 surrounding each of the sub-areas 19.

The plurality of sub-areas 19, each of which is rectangular, are arranged in a matrix including a plurality of rows and columns suitably spaced longitudinally and widthwise of the substrate 1. Each of the sub-areas 19 is formed with a wiring pattern 70 (partially omitted in the illustration) which is necessary for providing one infrared data communication module. The wiring pattern includes electrodes and pads for mounting a light emitting element, a light receiving element and an LSI chip. In FIG. 1, only pads are illustrated.

As shown in FIG. 2, the substrate 1 has a reverse surface 10b which provides dummy areas 21 in corresponding relation to the sub-areas 19, respectively. The dummy areas 21 are identical in size to the sub-areas 19. A conductor layer 20 is so formed as to surround each of the dummy areas 21. Each dummy area 21 includes a dummy pattern 22 which is so sized as to be substantially identical in total area to the wiring pattern 70 of a corresponding sub-area 19. The dummy pattern 22 has a thickness substantially identical to that of the conductor layer 20.

Figure 3:
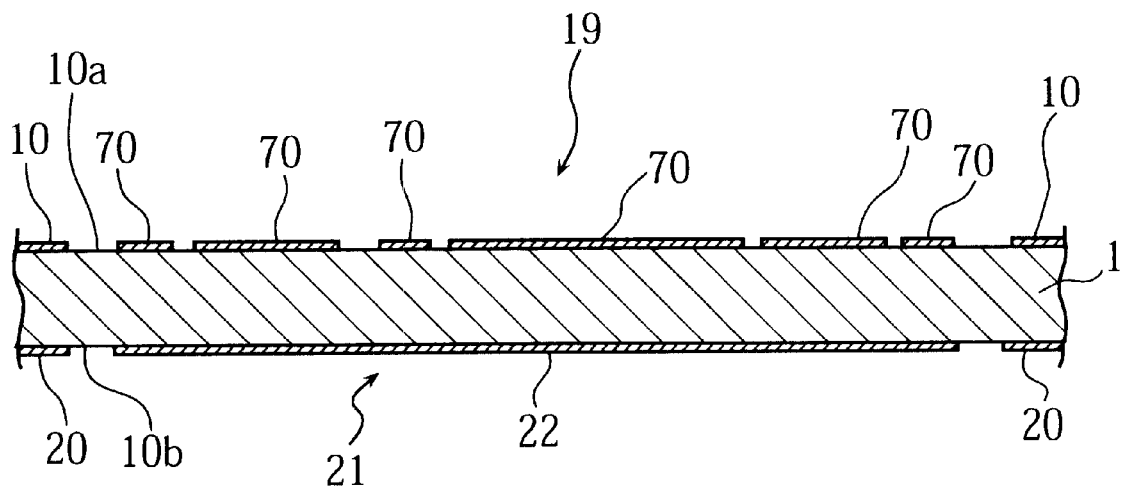
FIG. 3 is a sectional view taken along lines III—III in FIG. 1.
Figure 4:
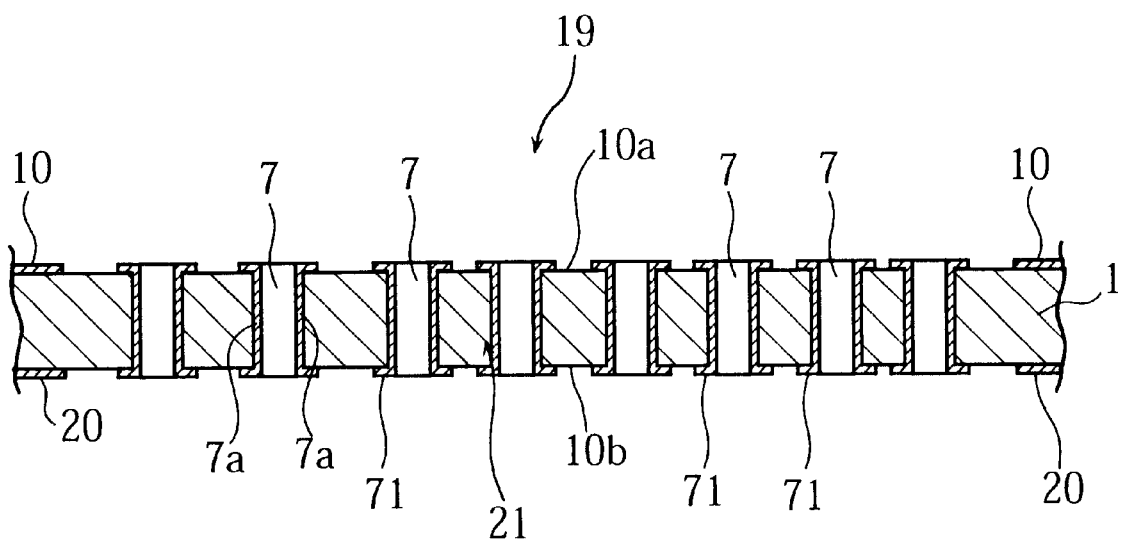
FIG. 4 is a sectional view taken along lines IV—IV in FIG. 1.

As shown in FIGS. 3 and 4, the sub-areas 19 are provided by forming a thin film conductor layer 10 entirely over the obverse surface 10a of the substrate 1 and then partially removing, by etching for example, rectangular portions of the conductor layer 10 corresponding to the sub-areas 19. Upon etching, part of the conductor layer 10 remains within each sub-area 19 to provide a wiring pattern 70.

Like the sub-areas, the dummy areas 21 are provided by forming a thin film conductor layer 20 entirely over the reverse surface 10b of the substrate 1 and then partially removing, by etching for example, rectangular portions of the conductor layer 20 corresponding to the dummy areas 21. Upon etching, part of the conductor layer 20 remains within each dummy area 21 to provide a dummy pattern 22. The conductor layer 20 including the dummy patterns 22 makes the reverse surface 10b of the substrate 1 less irregular.

Each of the wiring patterns 70 is electrically connected to a plurality of through-holes 7 aligned widthwise of the substrate 1. Each of the through-holes 7 extends through the thickness of the substrate 1. The through-hole 7 includes a conductor layer 7a formed on its inner circumferential surface for conduction with each of plural terminals 71 formed on the reverse surface 10b of the substrate 1. The terminals 71 are connected to the conductor layer 20 on the reverse surface 10b of the substrate 1.

Figure 5:
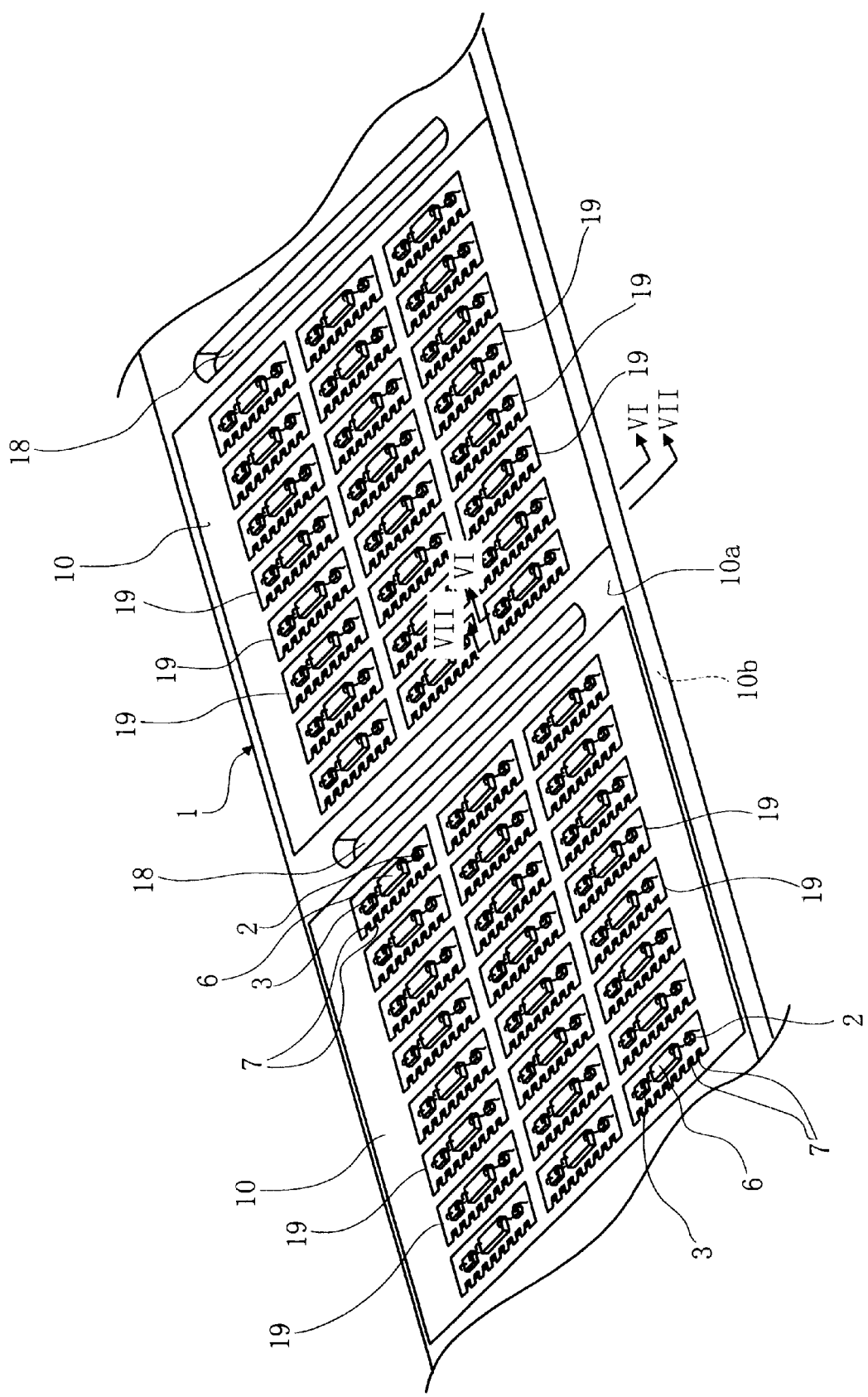
FIG. 5 is a perspective view of the substrate on which components are mounted.
Figure 6:
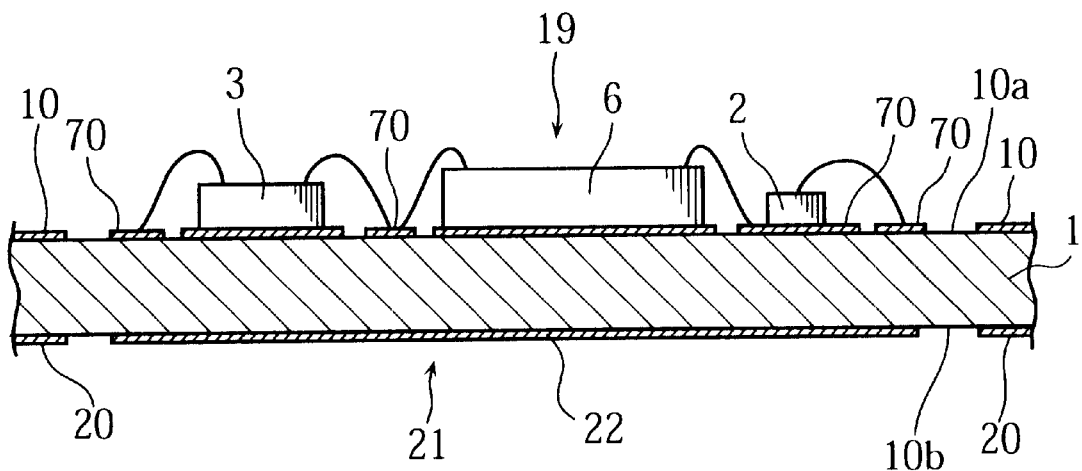
FIG. 6 is a sectional view taken along lines VI—VI in FIG. 5.
Figure 7:
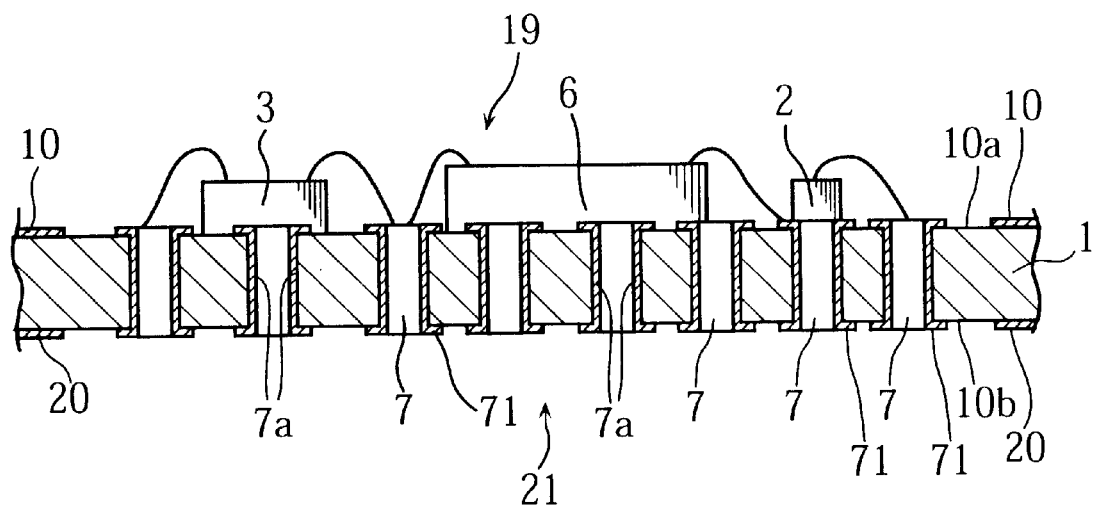
FIG. 7 is a sectional view taken along lines VII—VII in FIG. 5.

Each of the sub-areas 19 is provided with a respective set of components including a light emitting element 2, a light receiving element 3 and an LSI chip 6 mounted on the respective pads of the wiring pattern 70, as shown in FIGS. 5 through 7. The light emitting element 2 may comprise an infrared light emitting diode for example. The light receiving element 3 may comprise a PIN photodiode capable of detecting infrared. The LSI chip 6 controls the infrared emission and reception of the light emitting element 2 and the light receiving element 3, respectively. Specifically, the LSI chip 6 includes a modem circuit and a waveform shaping circuit. The light emitting element 2, the light receiving element 3 and the LSI chip 6 in each set are aligned in a row extending widthwise of the substrate 1.

The light emitting element 2, the light receiving element 3 and the LSI chip 6 are connected to the electrodes of the wiring pattern 70 by wire-bonding. The light emitting element 2, the light receiving element 3 and the LSI chip 6 are electrically connected to the through-holes 7 via the wiring pattern 70.

Figure 8:
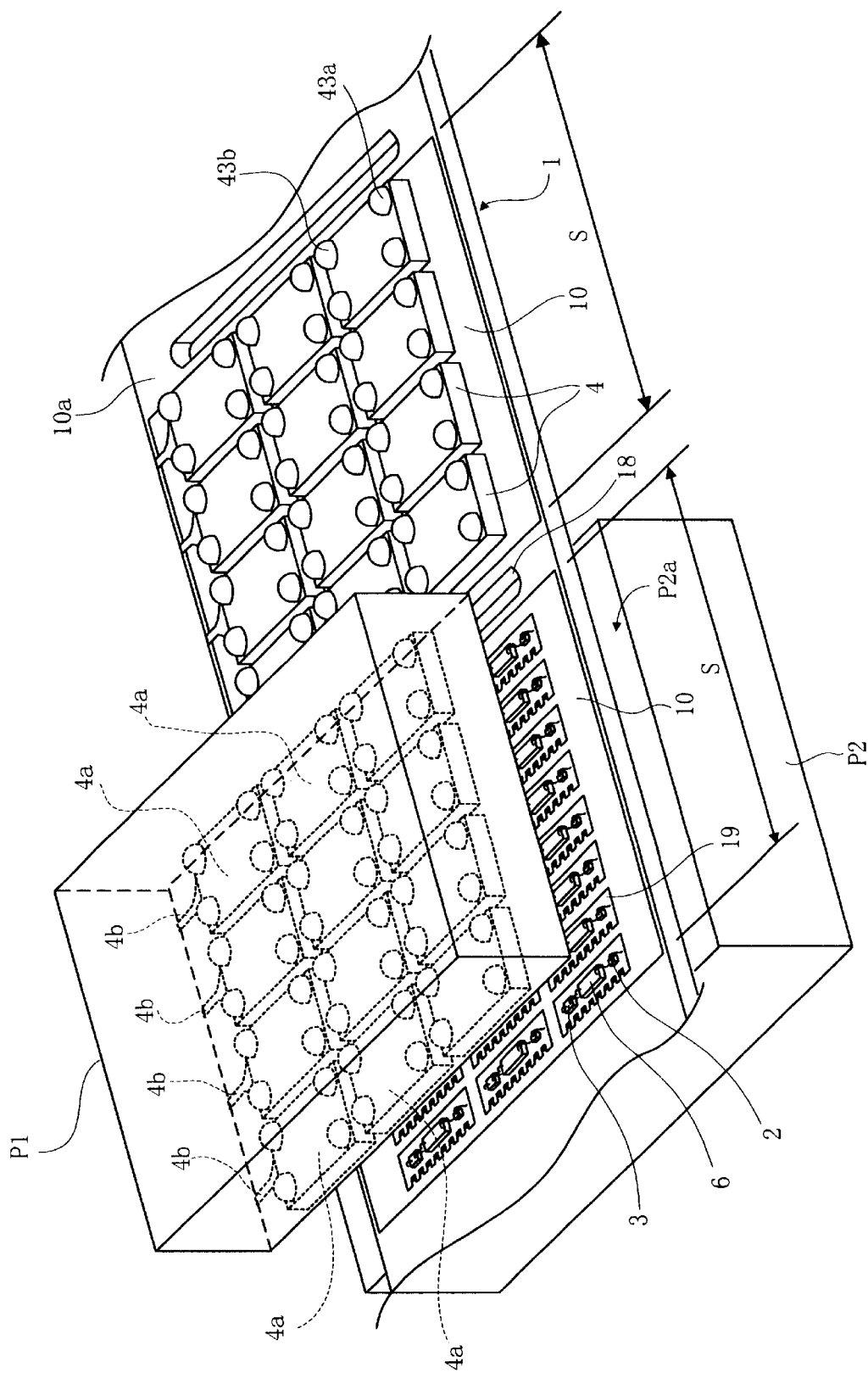
FIG. 8 is a perspective view showing a sealing step in making infrared data communication modules.
Figure 9:
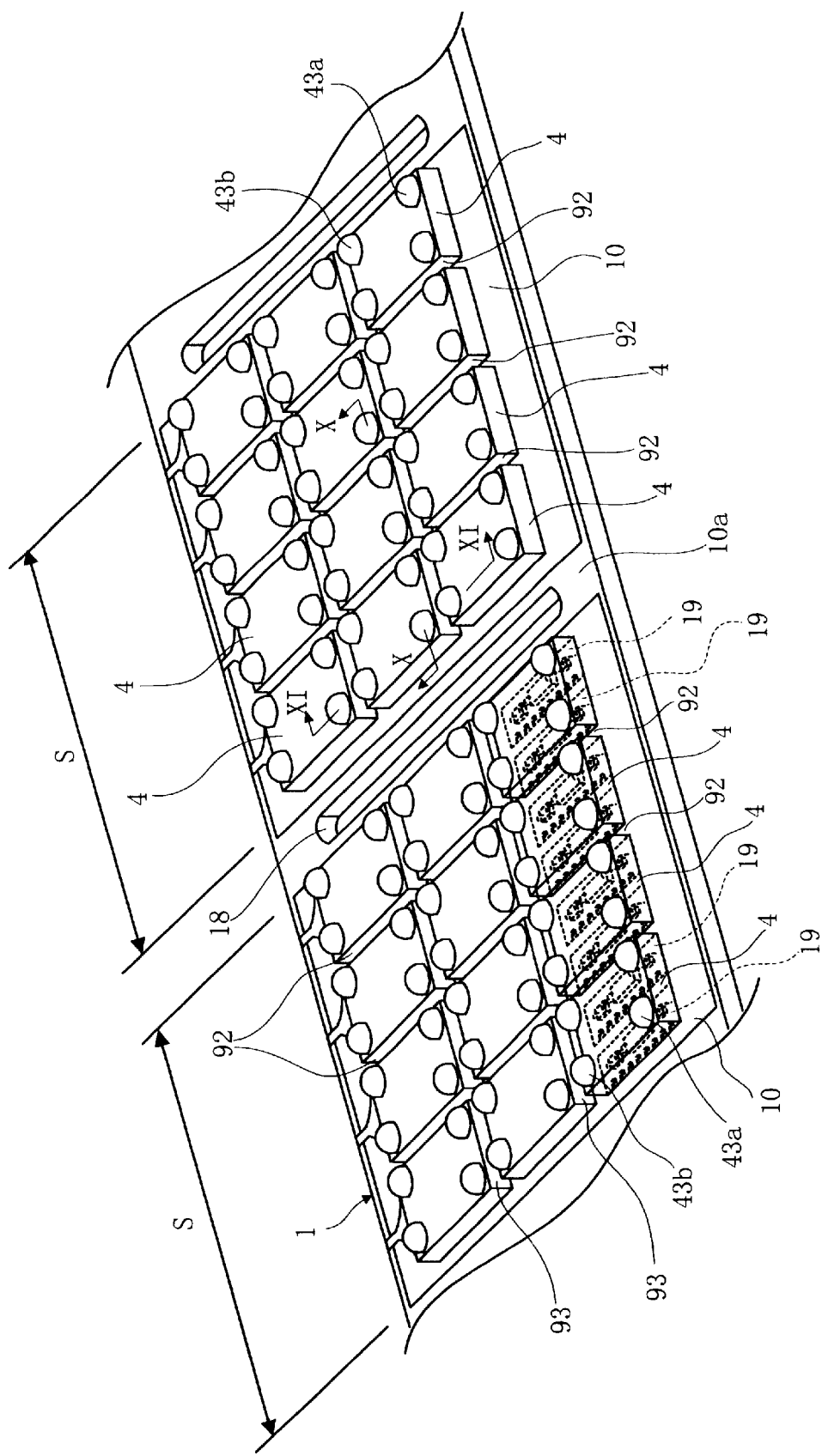
FIG. 9 is a perspective view of the substrate provided with resin packages.

After mounted on the substrate 1, the above-mentioned components are resin-packaged. The resin-packaging step is performed in a manner such that a plurality of resin packages 4 separate from each other are formed on each component mounting region S on the obverse surface 10a of the substrate 1, as shown in FIGS. 8 and 9. Each of the resin packages 4 may be formed of epoxy resin containing pigment for example, and has a property of blocking visible light while reliably passing infrared.

The resin packages 4 may be formed by transfer molding for example using a head and a tail mold members P1, P2, as shown in FIG. 8. The head mold member P1 includes cavities 4a which correspond in configuration to the resin packages 4. The tail mold member P2 has a flat pressing surface P2a for facing the substrate 1 from its reverse side.

The cavities 4a of the head mold member P1 in each row extending widthwise of the substrate 1 communicate with each other via a respective gate (not shown). The head mold member P1 is precisely positioned relative to the upper surface 10a of the substrate 1 so that each cavity 4a enclose two sub-areas 19. The tail mold member P2 presses against the entire reverse surface 10b of the substrate 1.

The substrate 1 is compressively held between the upper and tail mold members P1, P2. After resin is injected via runners 4b into the cavities 4a and caused to harden, the mold members P1, P2 are opened, thereby providing a molded product, as shown in FIG. 9.

Figure 10:
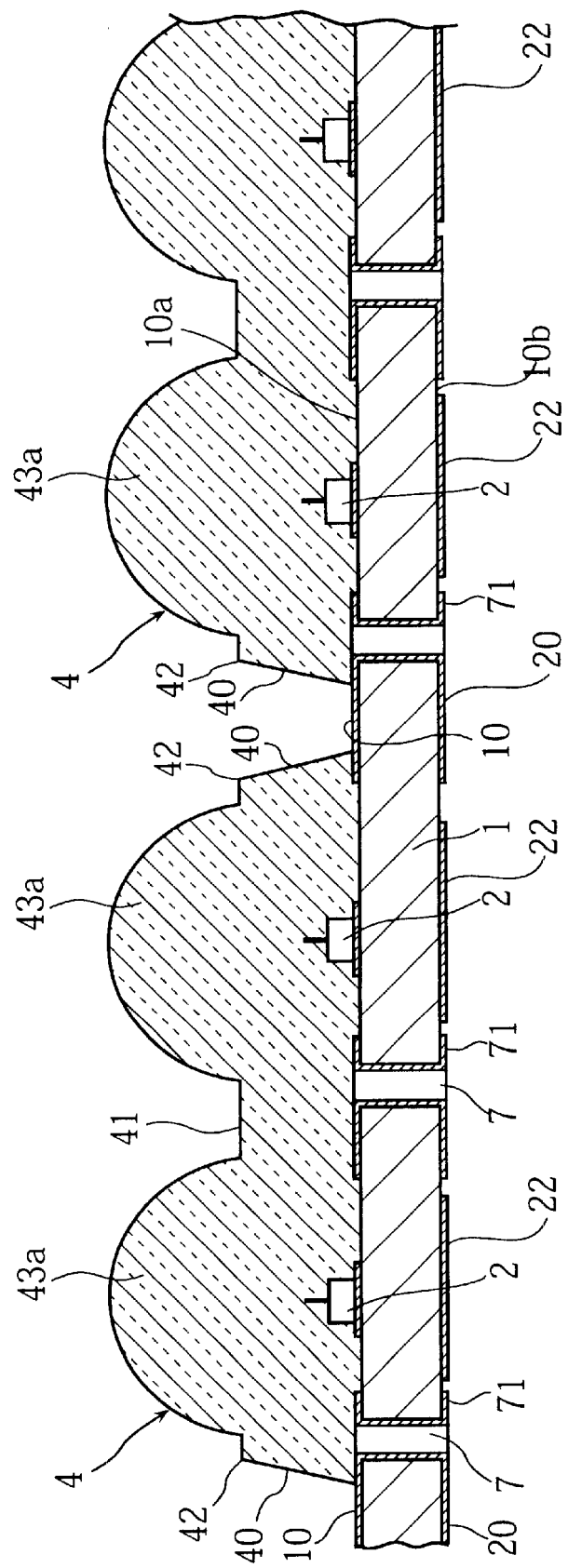
FIG. 10 is a sectional view taken along lines X—X in FIG. 9.
Figure 11:
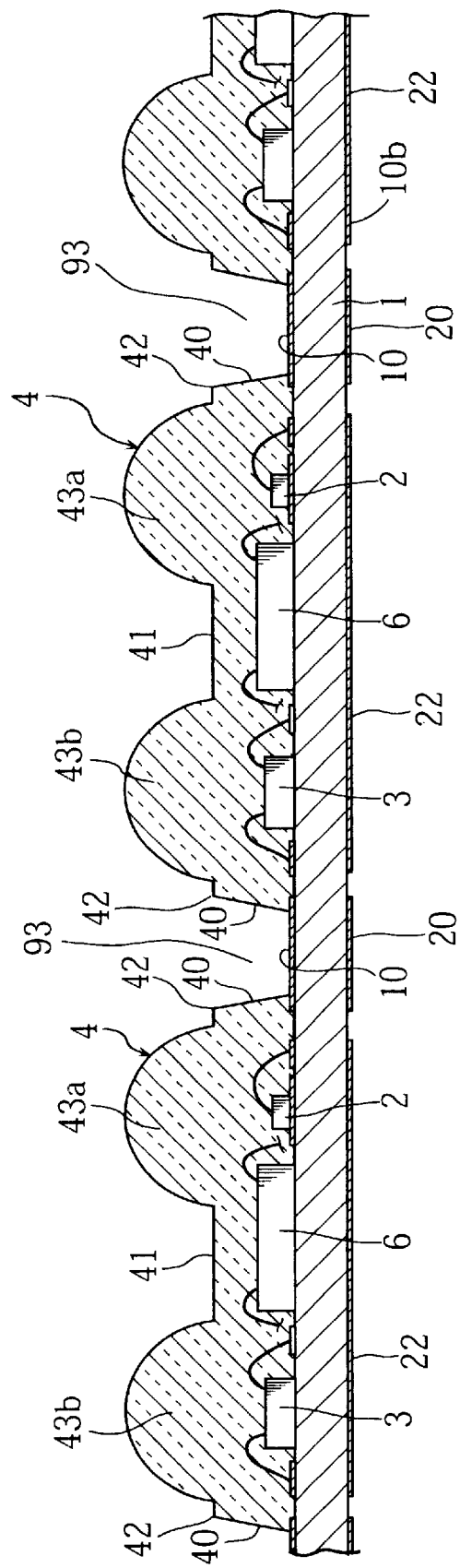
FIG. 11 is a sectional view taken along lines XI—XI in FIG. 9.

As shown in FIGS. 10 and 11, each of the resin packages 4 thus provided has a plurality of side surfaces 40 obliquely rising from the obverse surface 10a of the substrate 1. The resin package 4 further includes an upper surface 42 connected to upper edges 42 of the side surfaces 40,. The side surfaces 40 are inclined because the cavities 4a the head mold member P1 need to have drafts for facilitating mold opening.

The upper surface 41 is provided with a pair of hemispherical lens portions 43a, 43b formed by bulging the upper surface upwardly. The lenses 43a, 43b provide directivity for light transmission of the light emitting element 2 and light reception of the light receiving element 3.

As viewed longitudinally of the substrate 1, each of the thus molded resin packages collectively seals two sets of light emitting elements 2, light receiving elements 3 and LSI chips 6 respectively mounted on two adjacent sub-areas 19. Therefore, when eight sets of light emitting elements 2, light receiving elements 3 and LSI chips 6 are arrayed longitudinally of the substrate 1 in a respective component mounting region S, four resin packages 4 are provided in a row extending in that direction. Three clearances 92 of a suitable width are provided between the four resin packages 4.

As viewed widthwise of the substrate 1, each of the resin packages 4 is formed to seal a set of light emitting element 2, light receiving element 3 and LSI chip 6. Clearances 93 of a suitable width are formed between the resin packages 4.

According to the molding step described above, the total number of the clearances 92 provided longitudinally of the substrate 1 can be reduced in comparison with the case where a resin package is provided for each sub-area 19. Therefore, wasting of space of the substrate 1 can be reduced as much as the total number of the clearances 92 is reduced, thereby increasing the number of infrared data communication modules obtainable from a single substrate 1. Moreover, since an appropriate number of clearances 92, 93 are still provided between the resin packages 4 longitudinally and widthwise of the substrate 1, the substrate is prevented from warping to a large extent longitudinally and/or widthwise due to intimate contact between the resin packages and the obverse surface 10a of the substrate 1.

The above-described resin-packaging step is performed successively for the component mounting regions S arranged longitudinally of the substrate 1. Since two adjacent component mounting regions S are divided by a slit 18, the substrate 1 is readily bendable at the slit 18. Therefore, even if a bending force is applied to any component mounting region S, such a force is absorbed by the deformation of the substrate 1 at the relevant slit 18.

In this way, a bending force applied to any component mounting region S on the substrate 1 does not adversely affects an adjacent component mounting region. As a result, it is possible to more reliably prevent the substrate 1 from flexing in each component mounting region S.

Instead of collectively sealing two sets of light emitting elements 2 and light receiving elements 3, each resin package 4 may collectively seal three or more sets of such components. As the number of the component sets sealed by a single resin package increases, the number of the clearances between the resin packages 4 decreases. Thus, it is possible to increase the total number of infrared data communication modules obtainable from a single substrate.

In molding the resin packages 4, resin on each sub-area 19 may flow via the through-holes 7 onto the reverse surface 10b of the substrate 1. Even if the openings of the through-holes 7 are closed by a suitable resist film (not shown) to prevent the resin from flowing into the through-holes, the resist film in contact with the hot resin may melt. Also in such a case, the resin may flow via the through-holes 7 onto the reverse surface 10b of the substrate 1.

However, according to the present invention, the reverse surface 10b of the substrate 1 is formed with dummy patterns 22 in addition to the terminals 71 around the through-holes 7, and the dummy patterns 22 are identical in thickness with the terminals 71. As a result, the reverse surface of the substrate is generally planer with little irregularities.

Therefore, when the upper and tail mold members P1, P2 press against the substrate 1, the surface pressure against the sub-areas 19 and the dummy areas 21 is increased. Accordingly, the pressing surface P2a (See FIG. 8) of the tail mold member P2 comes into intimate contact with the terminals 71 and the dummy patterns 22 around the through-holes 7 on the reverse surface 10b of the substrate 1 without any clearance. In other words, the through-holes 7 are reliably closed by the flat pressing surface P2a of the tail mold member P2 on the reverse surface 10b of the substrate 1. Therefore, even if resin flows into the through-holes 7 from the obverse surface 10a of the substrate 1, the resin does not flow out of the through-holes 7 onto the reverse surface 10b. As a result, it is possible to prevent the resin from adhering to the reverse surface 10b of the substrate 1.

Figure 12:
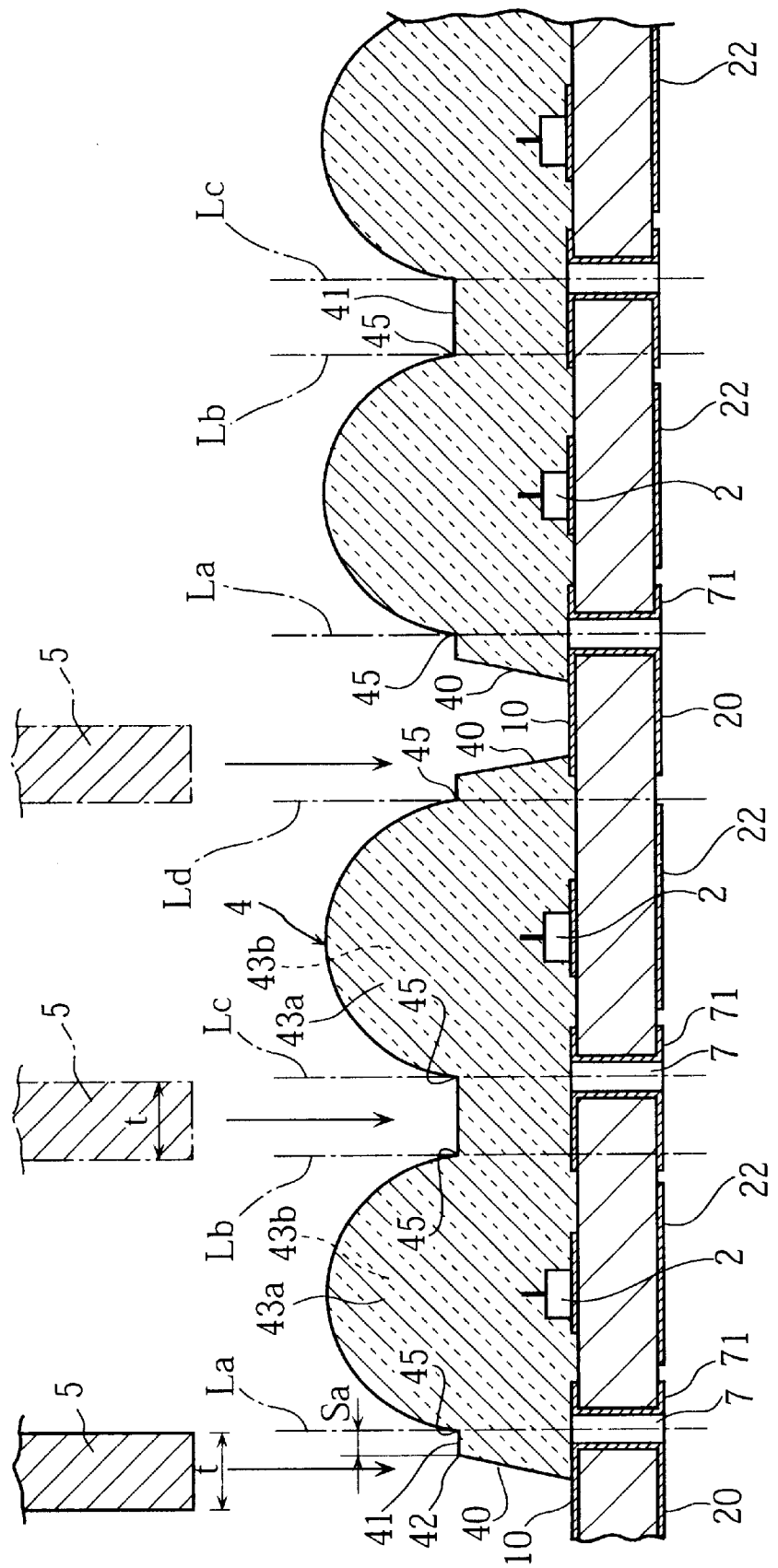
FIG. 12 is a sectional view showing a cutting step in making infrared data communication modules.
Figure 13:
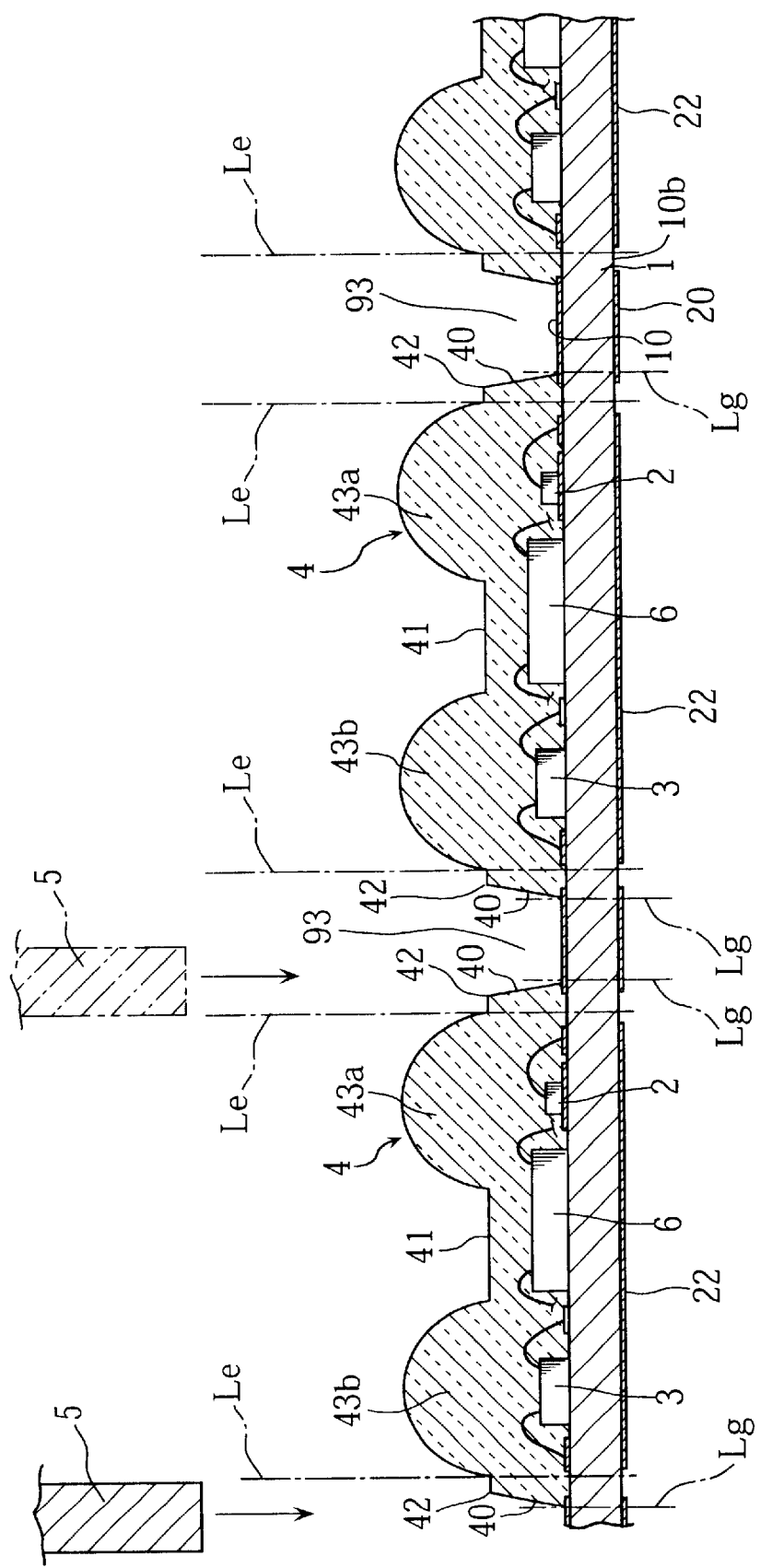
FIG. 13 is a sectional view showing the cutting step in making infrared data communication modules.

After the resin-packaging step is completed, the substrate 1 together with the resin packages 4 formed thereon are cut to divide the substrate 1 and the mounted components into a plurality of infrared data communication modules, as shown in FIGS. 12 and 13. At this time, the substrate 1 is cut both longitudinally and widthwise thereof.

The substrate 1 may be cut with a rotary discal blade 5. For longitudinal division, the substrate 1 may be cut at portions indicated by phantom lines La~Ld in FIG. 12. The phantom lines La~Ld traverse the upper surface 41 of each resin package 4. Each of the phantom lines La, Ld at two widthwise opposite sides of the package is located inwardly from the upper edge 42 of a side surface 40 of a respective resin package 4 by a predetermined amount Sa. Therefore, when the substrate 1 and the resin packages 4 are cut along the phantom lines La, Ld, the inclined side surfaces 40 are cut away from the resin package 4. The phantom lines La extend through the through-holes 7 so that the through-holes 7 are divided when the substrate 1 is cut.

Each of the phantom lines Lb, Lc is located generally at a central portion widthwise of a respective resin package 4. By performing cutting along the phantom lines Lb, Lc, each of the resin packages 4 is divided to provide two infrared data communication modules each of which includes a set of light emitting element 2, light receiving element 3 and LSI chip 6. The phantom lines Lc also extend through the through-holes 7 so that the through-holes 7 are divided when the substrate 1 is cut.

If the cutting blade 5 has a thickness t which is equal to the distance between the phantom lines Lb and Lc, the cutting along these phantom lines Lb and Lc can be performed by a single cutting operation. Therefore, it is possible to reduce the number of cutting operations.

For widthwise division of the substrate 1, the substrate 1 and the resin packages 4 may be cut at positions indicated by phantom lines Le for example, as shown in FIG. 13. Similarly to the cutting operation performed at the phantom lines La, Ld shown in FIG. 12, the resin packages 4 are cut for removing the inclined side surfaces 40 of the resin packages 4.

However, the cutting operation may be performed so as to partially or entirely retain the inclined side surfaces 40 of the resin packages 4. For example, instead of cutting the substrate 1 and the resin packages 4 along the phantom lines Le, only the substrate 1 may be cut at positions indicated by phantom lines Lg shown in FIG. 13.

Figure 14:
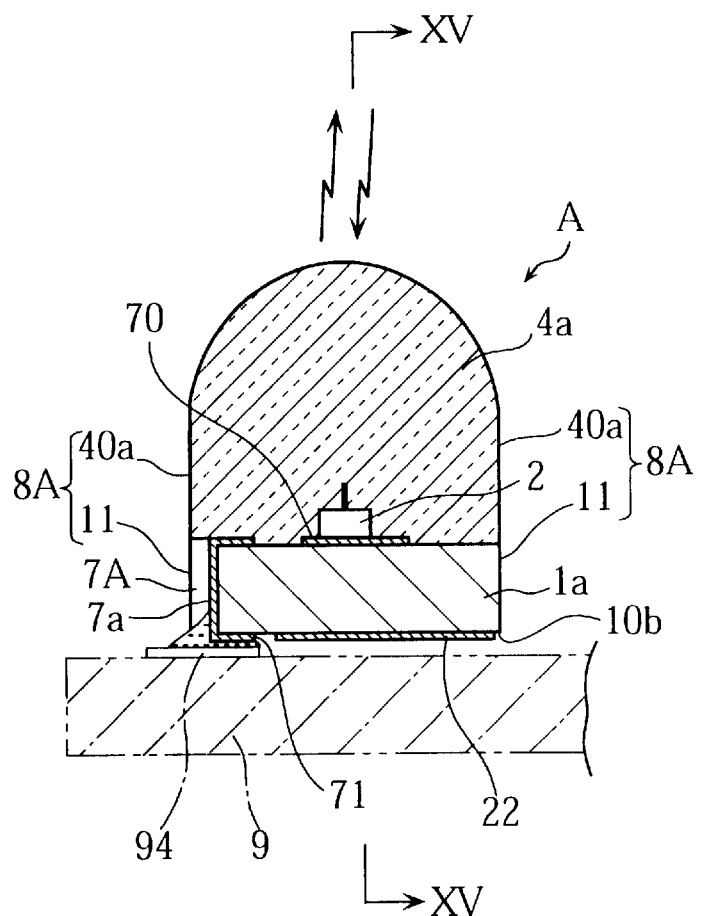
FIG. 14 is sectional view showing a mode for mounting an infrared data communication module.
Figure 15:
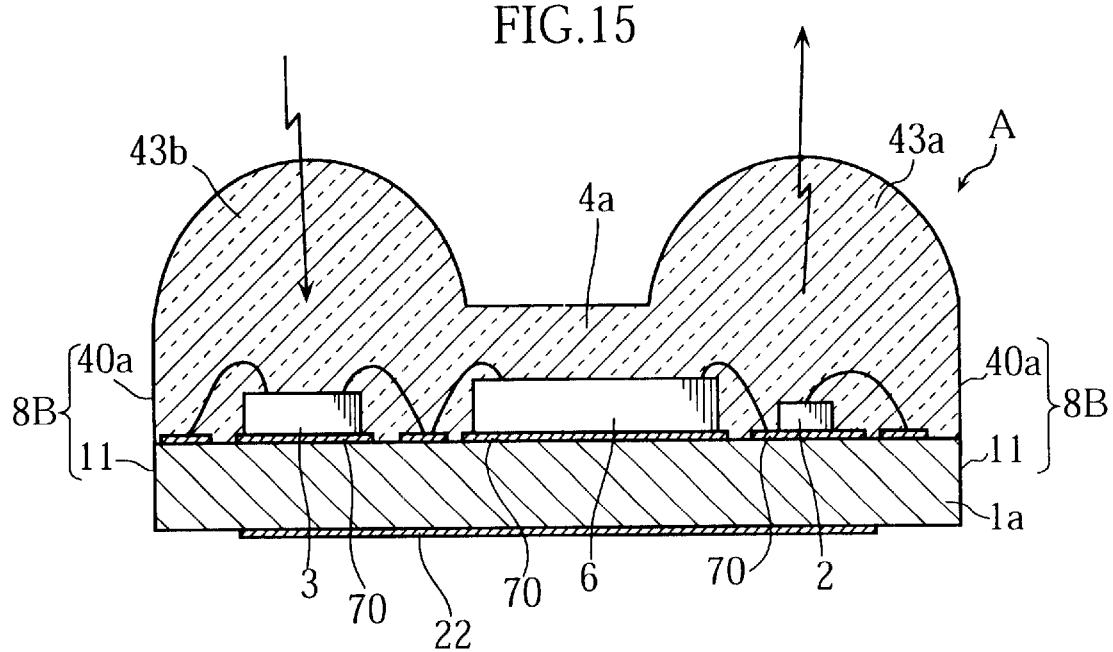
FIG. 15 is a sectional view taken along lines XV—XV in FIG. 14.
Figure 16:
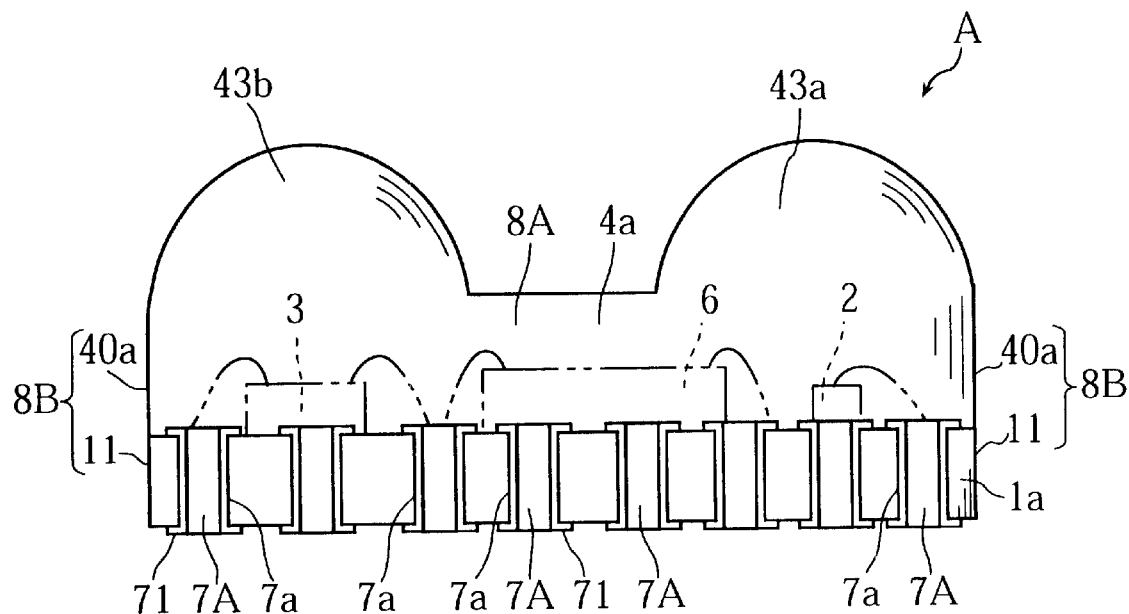
FIG. 16 is a side view of the infrared data communication module.

By performing the above-described steps in succession, a plurality of infrared data communication modules are provided, each of which is configured as shown in FIGS. 14 through 16. The infrared data communication module thus provided includes a light emitting element 2, a light receiving element 3 and an LSI chip 6 as mounted on a rectangularly cut substrate 1a and as sealingly enclosed in a rectangularly cut resin package 4a.

The resin package 4a no longer has the previously present side surfaces 40 obliquely rising from the obverse surface of the substrate 1a. Instead, the resin package 4a has side surfaces 40a each of which is a smooth flat cut surface in flush with a corresponding cut surface 11 of the substrate 1a. Specifically, the infrared data communication module A includes two flat surfaces 8A and two flat surfaces 8B, each flat surface comprising a cut surface 11 and a side surface 40a connected to and flush with each other. Each flat surface 8A extends longitudinally of the infrared data communication module A, whereas each flat surface 8B extends perpendicularly to the flat surfaces 8A. One of the flat surfaces 8A is formed with a plurality of grooves 7A formed by dividing the plurality of through-holes 7. The conductor layers 7a connected to the respective terminals 71 are exposed at the grooves 7A.

The infrared data communication modules A having the above structure is made from the master substrate 1 which is not largely flexed before being divided into the cut substrates 1a. Therefore, die-bonding and wire-bonding portions for the light emitting element 2, the light receiving element 3 and the LSI chip 6 mounted on the substrate 1a are not flexed either, thereby providing a good quality for the infrared data communication module A.

The infrared data communication module 1 may be used in the following two different modes for example. In a first mode, the infrared data communication module A is mounted on a module mounting board 9 with the reverse surface 10b of the substrate 1a oriented downward, as shown in FIG. 14.

For such mounting, the terminals 71 on the reverse surface 10b of the substrate 1a are bonded onto corresponding terminals 94 on the module mounting board 9 by reflow soldering for example. The solder may be applied so as to contact not only the terminals 71 but also the conductor layers 7a at the grooves 7A. Therefore, it is possible to increase the mounting strength of the infrared data communication module A onto the module mounting board 9. According to the first mode, infrared is transmitted and received perpendicularly to the obverse surface of the module mounting board 9.

Figure 17:
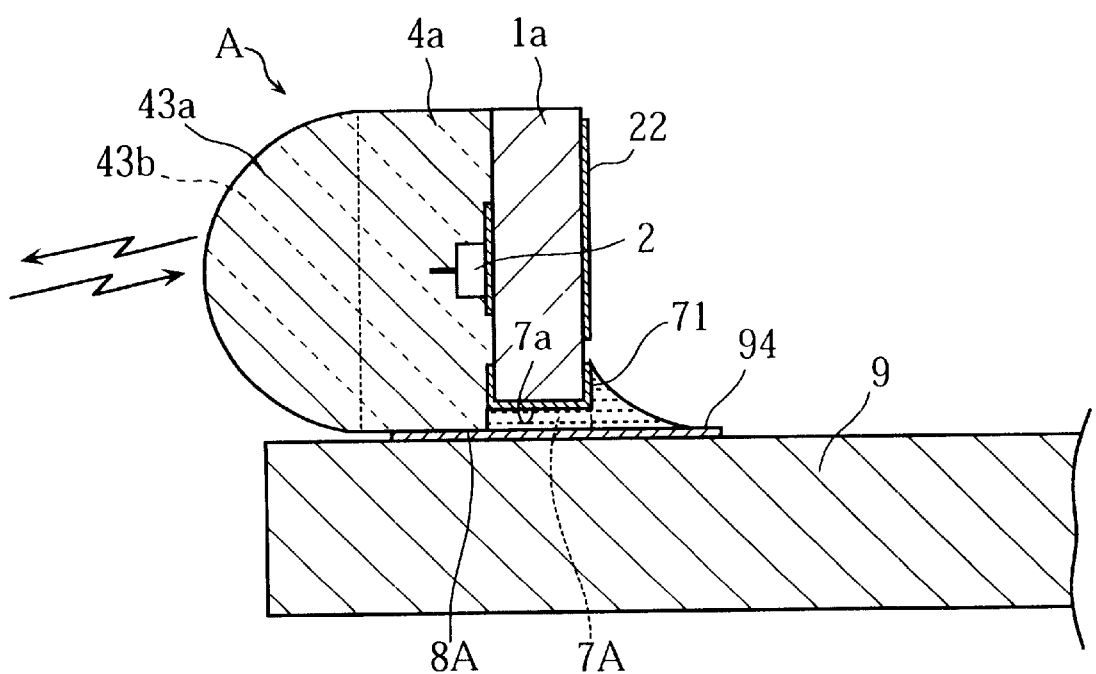
FIG. 17 is sectional view showing another mode for mounting the infrared data communication module.

FIG. 17 illustrates a second mode for using the infrared data communication module A. In this second mode, the infrared data communication module A is mounted with one of the surfaces 8A oriented downward so that the conductor layers 7a at the grooves 7A face the terminals 94 of the module mounting board 9. Since the surface 8A has a large width which is the sum of the thickness of the substrate 1a and the thickness of the resin package 4a excluding the lens portions 43a, 43b, the infrared data communication module A can be stably carried on the module mounting board 9.

In this way, the infrared data communication module A may be conveniently mounted onto the module mounting board 9 by reflow soldering. In soldering the conductor layers 7a onto the terminals 94, the solder may be brought into contact with the terminals 71. Thus, it is possible to increase the mounting strength of the infrared data communication module A.

Figure 18:
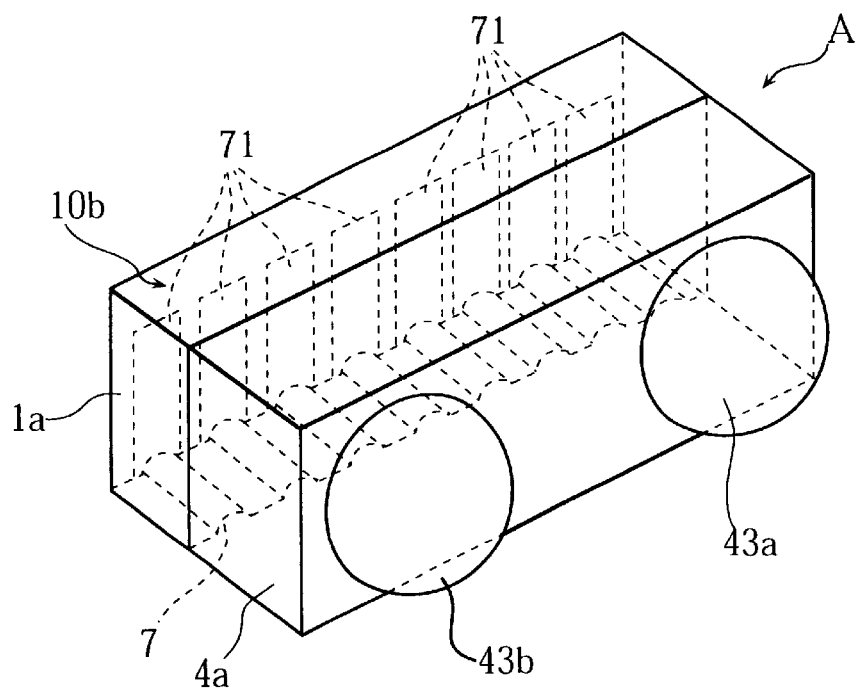
FIG. 18 is a perspective view of an infrared data communication module in accordance with a second embodiment of the present invention.
Figure 19:
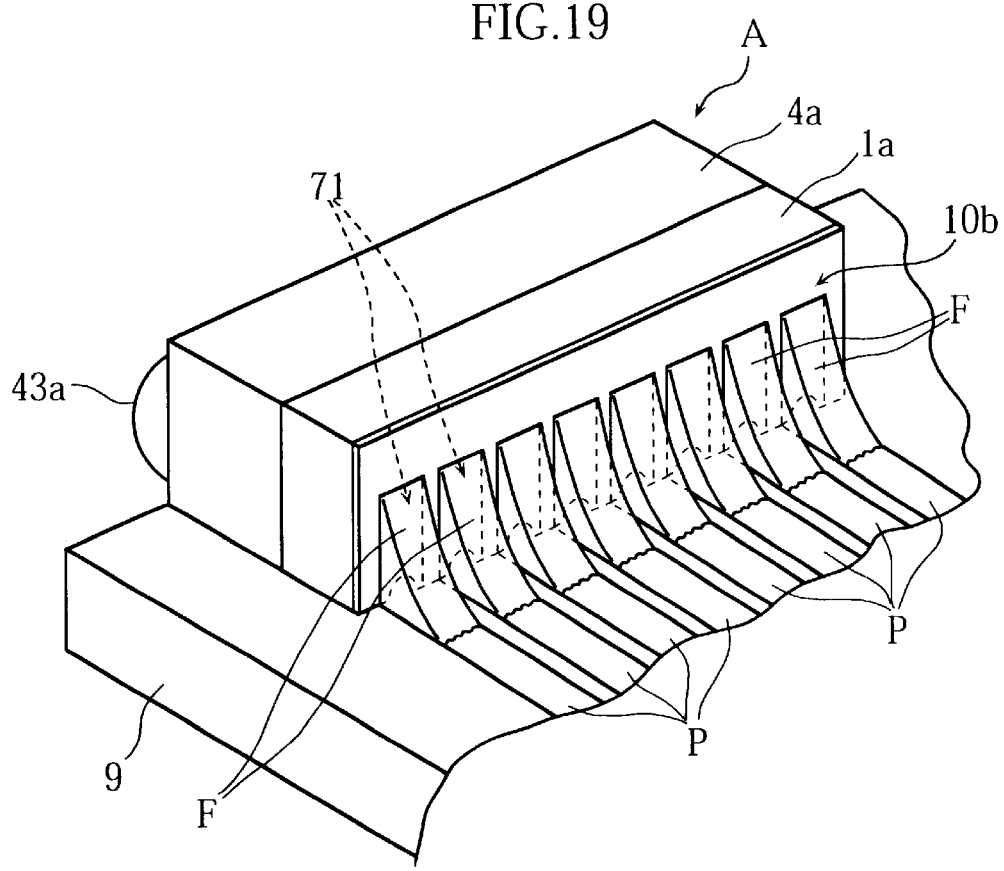
FIG. 19 is a perspective view showing the infrared data communication module of FIG. 18 in its mounted state.
Figure 20:
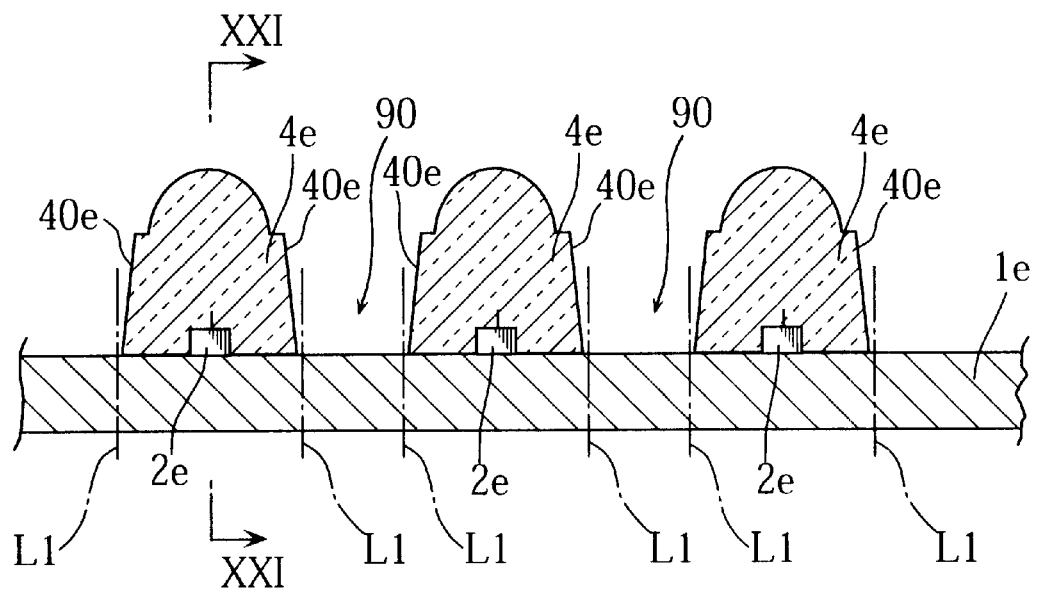
FIG. 20 is a sectional view showing a substrate used in a conventional method of making infrared data communication modules.
Figure 21:
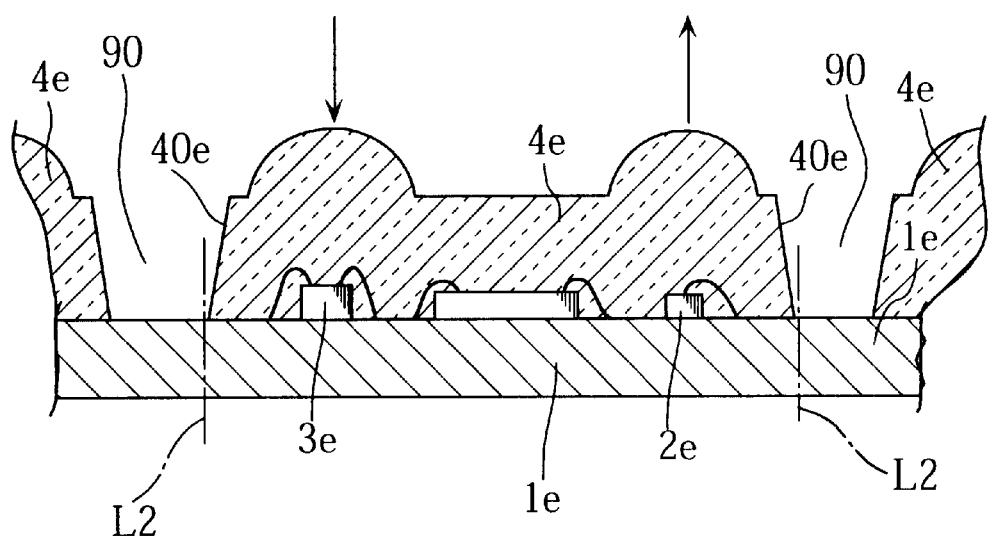
FIG. 21 is a sectional view taken along lines XXI—XXI in FIG. 20.
Figure 22:
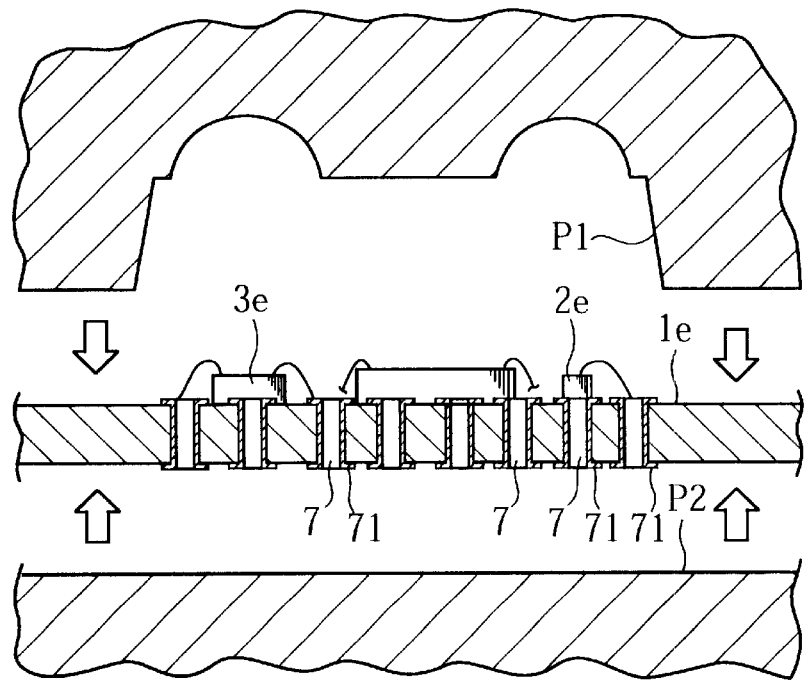
FIG. 22 is a sectional view showing a substrate and a mold used in the conventional method of making infrared data communication modules.
Figure 23:
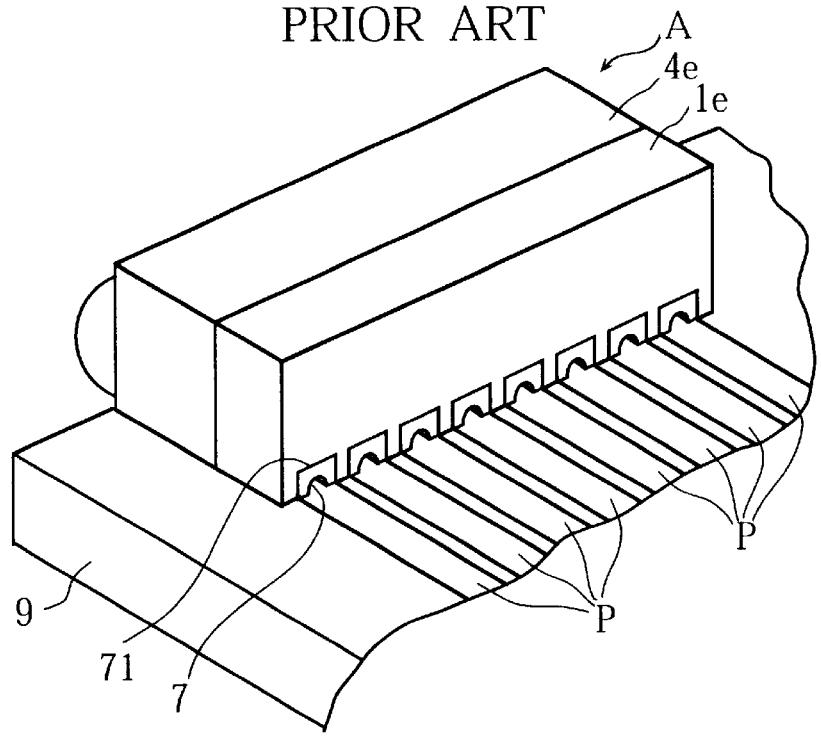
FIG. 23 is a perspective view showing a conventional infrared data communication module in its mounted state.

Now, reference is made to FIGS. 18 and 19 which illustrate an infrared data communication module according to a second embodiment of the present invention. The infrared data communication module A is formed with terminals 71 each of which is elongated into a generally rectangular configuration. The terminals 71 are formed instead of the dummy pattern 22 in the dummy area 21 on the reverse surface 10b of the substrate 1 in the first embodiment.

Generally, in forming an infrared data communication module A, an insulating layer is formed, by photolithography for example, so as to cover the reverse surface 10b of a substrate 1 but to expose the terminals 71. In forming such an insulating layer, the light exposure step is performed with the use of a mask which is formed with apertures positionally corresponding to the terminals 71. Then, unnecessary portions of the insulating layer are removed by development.

According to the second embodiment, since the terminals 71 are elongated rectangularly, the mask may positionally deviate longitudinally of the terminals 71 to a certain extent. Further, since the terminals 71 provide a sufficient area, they can be advantageously utilized for bonding to the module mounting board 9.

Specifically, as shown in FIG. 19, the reverse surface 10a is oriented perpendicularly to the obverse surface of the module mounting board 9 in mounting the infrared data communication module A onto the module mounting board 9 by soldering. At this time, a solder fillet F is formed between each terminal 71 of the substrate 1 and a corresponding wiring pattern P of the module mounting board 9. Since the terminal 71 is elongated, the amount of the solder fillet F may be rendered appropriately large. As a result, the terminal 71 and the wiring pattern P can be firmly bonded, increasing the mounting strength of the infrared data communication module A onto the module mounting board 9.

More specifically, each terminal 71 extend perpendicularly to the obverse surface of the module mounting board 9. Since the wiring pattern P on the module mounting board 9 has a limited width, there is a limitation on increasing the width of the terminals 71 on the reverse surface 10b of the substrate 1a longitudinally thereof. However, it is possible to elongate the terminal 71 perpendicularly to the obverse surface of the module mounting board 9 as long as possible within the width of the substrate 1a. Therefore, a sufficient amount of solder fillet can be formed in that direction at the terminal 71 so that the terminal 71 and the wiring pattern P are joined strongly.

What is claimed is:

1. A method of making infrared data communication modules comprising the steps of:

forming predetermined conductor patterns on an obverse and a reverse surfaces of a substrate;

mounting, on one of the surfaces of the substrate, plural sets of light emitting elements and light receiving elements;

resin-molding a non-cut package which encloses the plural sets of light emitting elements and light receiving elements on the substrate; and dividing the non-cut package into a plurality of cut packages each of which encloses a respective set of light emitting element and light receiving element;

wherein the mounting step includes arranging the plural sets of light emitting elements and light receiving elements in a matrix on said one surface of the substrate; and wherein the resin-molding step includes forming a plurality of non-cut packages arranged in a matrix.

2. The method of making infrared data communication modules according to claim 1, wherein the substrate is elongated in one direction, the substrate being formed with a plurality of slits extending widthwise of the substrate and spaced from each other longitudinally of the substrate, the plural sets of light emitting elements and light receiving elements being mounted on said one surface of the substrate in each of regions defined between the slits.

3. The method of making infrared data communication modules according to claim 1, wherein the pattern forming step includes forming, on the reverse surface of the substrate, terminals for connection to through-holes penetrating the substrate thicknesswise together with dummy patterns which are substantially equal in thickness to the terminals.

4. The method of making infrared data communication modules according to claim 1, wherein the pattern forming step includes forming, on the reverse surface of the substrate, terminals for connection to through-holes penetrating the substrate thicknesswise, the terminals being elongated to be substantially rectangular for bonding to an external mounting board.

5. An infrared data communication module comprising:

a substrate having an obverse surface and a reverse surface, a wiring pattern formed on the obverse surface of the substrate, a set of light emitting element and light receiving element mounted on the obverse surface of the substrate in electrical connection to the wiring pattern, a resin package formed on the obverse surface of the substrate for enclosing the set of light emitting element and light receiving element, a plurality of terminals formed on the reverse surface of the substrate in electrical connection to the wiring pattern, and a dummy pattern formed on the reverse surface of the substrate but electrically separated from the wiring pattern and the terminals, the dummy pattern corresponding in position and in general configuration to the wiring pattern.

* * * * *